(12) United States Patent
Schmitz et al.

(10) Patent No.: US 6,271,551 B1
(45) Date of Patent: *Aug. 7, 2001

(54) SI-GE CMOS SEMICONDUCTOR DEVICE

(75) Inventors: Jurriaan Schmitz; Pierre H. Woerlee, both of Eindhoven (NL)

(73) Assignee: U.S. Philips Corporation, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/764,914

(22) Filed: Dec. 13, 1996

(30) Foreign Application Priority Data

Dec. 15, 1995 (EP) .................................. 95203512

(51) Int. Cl.$^7$ .................................................. H01L 29/76
(52) U.S. Cl. .............................................................. 257/288
(58) Field of Search ............................................... 257/288

(56) References Cited

U.S. PATENT DOCUMENTS

| | | | |
|---|---|---|---|
| 4,506,434 | 3/1985 | Ogawa et al. | 29/571 |
| 5,166,765 | 11/1992 | Lee et al. | 257/345 |
| 5,242,847 | 9/1993 | Ozturk et al. | 437/41 |
| 5,298,435 | * 3/1994 | Aronowitz et al. | 437/24 |
| 5,378,920 | * 1/1995 | Nakagawa et al. | 257/487 |
| 5,500,391 | * 3/1996 | Beuk et al. | 437/131 |
| 5,548,143 | * 8/1996 | Lee | 257/269 |

* cited by examiner

Primary Examiner—Olik Chaudhuri
Assistant Examiner—Douglas A. Wille
(74) Attorney, Agent, or Firm—Steven R. Biren

(57) ABSTRACT

To obtain a high mobility and a suitable threshold voltage in MOS transistors with channel dimensions in the deep submicron range, it is desirable to bury a strongly doped layer (or ground plane) in the channel region below a weakly doped intrinsic surface region, a few tens of nm below the surface. It was found, however, that degradation of the mobility can occur particularly in n-channel transistors owing to diffusion of boron atoms from the strongly doped layer to the surface, for example during the formation of the gate oxide. To prevent this degradation, a thin layer 11 of $Si_{1-x}Ge_x$ inhibiting boron diffusion is provided between the strongly doped layer 10 and the intrinsic surface region 7, for example with x=0.3. The SiGe layer and the intrinsic surface region may be provided epitaxially, the thickness of the SiGe layer being so small that the lattice constants in the epitaxial layers do not or substantially not differ from those in the substrate 1 in a plane parallel to the surface, while a sufficient diffusion-inhibiting effect is retained. Since SiGe has a diffusion-accelerating rather than decelerating effect on n-type dopants, the ground plane of a p-channel transistor in a CMOS embodiment is doped with As or Sb because of the low diffusion rate of these elements in pure silicon.

6 Claims, 5 Drawing Sheets

SI-GE CMOS SEMICONDUCTOR DEVICE

BACKGROUND OF THE INVENTION

The invention relates to a semiconductor device comprising a semiconductor body of silicon with a p-type surface region adjoining a surface and provided with an n-type channel field effect transistor with insulated gate and with n-type source and drain zones provided in the surface region and mutually separated by an interposed channel region also adjoining the surface, while the surface region is provided with a buried p-type doped zone which extends below the channel region at a small distance from the surface and which has a higher doping concentration than the channel region. Such a device is known from U.S. Pat. No. 5,166,765.

The mobility of the charge carriers in the channel, often indicated with the symbol $\mu$ and expressed in $cm^2/V.s$, is an important parameter in MOS transistors with channel dimensions in the deep sub-micron region (for example, 0.1 micron), inter alia in view of the capacity of the transistor to conduct current. The mobility is strongly dependent on the value of the electric field in the channel, at least on the component of the field transverse to the surface. In general, the mobility decreases with an increasing field strength. The doping concentration in the channel should accordingly be very low in order to obtain a high mobility, for example of the order of $10^{15}$ atoms per $cm^3$ (intrinsic silicon). Such a low doping level, however, is not possible because punch-through to the source occurs at very low drain voltages already with this doping. In addition, low channel doping levels in combination with very small dimensions (for example, a channel surface area of 0.1 $\mu m \times 0.1 \mu m$) may lead to major fluctuations in the threshold voltage, which may be particularly unfavorable at lower supply voltages owing to fluctuations in the doping level. These problems are solved in principle in a transistor as described in the cited U.S. Pat. No. 5,166,765. In this known transistor, the channel region comprises an intrinsic surface region which adjoins the surface, has a thickness of a few tens of nanometers, and is situated above and adjoining a thin p-type layer having a high concentration of boron atoms, for example of the order of $10^{18}$ per $cm^3$. A transistor constructed in this way has a high mobility of charge carriers, a high punch-through voltage, and a good threshold voltage. The extremely small dimensions, however, render it difficult to manufacture such a transistor in a reliable and reproducible manner. Moreover, a separate implantation of As ions is required in the channel region of the transistor so as to compensate for the B atoms present and make the silicon in the channel region intrinsic. Such an As implantation in the channel, however, is disadvantageous for the mobility of the charge carriers and for the process control, for example as regards the threshold voltage $V_T$.

SUMMARY OF THE INVENTION

The invention has for its object to provide a device of the kind described in the opening paragraph which can be manufactured in a reliable and reproducible manner. The invention also has for its object to provide such a device in which a separate As implantation in the - intrinsic - channel region is unnecessary, so that the mobility in the channel is not adversely affected by impurities.

According to the invention, a semiconductor device of the kind described in the opening paragraph is characterized in that the surface region is in addition provided with a buried $Si_{1-x}Ge_x$ layer (called SiGe layer hereinafter), x representing the molar fraction of Ge, extending below the channel region and forming a diffusion barrier between the comparatively weakly doped channel region adjoining the surface and the comparatively strongly doped buried p-type zone.

The invention is based inter alia on the recognition that the diffusion of boron atoms to the surface may be fairly strong owing to the small depth of the buried p-type zone, in particular because of the growing of the gate oxide during which empty places arise in the crystal lattice which promote the diffusion of boron atoms. The invention is further based on the recognition that this diffusion may be decelerated by a SiGe layer whose thickness is so small that the lattice distances, at least in a direction parallel to the surface, are equal or at least substantially equal to the lattice constants in the silicon crystal. This renders it possible to form the channel region through epitaxy of intrinsic silicon on the SiGe layer. The gate oxide may be formed in a subsequent step, during which the diffusion of boron atoms is decelerated by the SiGe layer.

It is noted that, wherever reference is made to an SiGe layer below, this should be understood to include all layers in which Si is replaced by Ge in a number of lattice points of the crystal. Besides Ge, the layer may comprise other substances, for example C, as long as the layer is electrically conducting, diffusion-inhibiting, and monocrystalline, so that an intrinsic silicon layer can be epitaxially deposited on the layer. The SiGe layer may be formed through implantation of Ge into the silicon crystal. This, however, leads to major damage in the crystal, in particular when the Ge content becomes greater, for example when x is approximately 0.3. A major preferred embodiment of a semiconductor device according to the invention, which has the advantage that the composition of the SiGe layer may be chosen within wide limits, is characterized in that the SiGe layer and the channel region adjoining the surface are formed by epitaxial layers.

Conventional separation techniques such as thick field oxide may be used for the lateral boundaries of the active regions in the semiconductor body. Since a thermal treatment of long duration is less desirable after the application of the SiGe layer and the intrinsic layer, the field oxide is preferably provided first, after which the SiGe layer and the intrinsic layer are deposited in the active regions, for example by selective epitaxy. An embodiment in which the provision of the lateral boundaries does not require a high-temperature step of long duration and in which the lateral boundaries can be provided after the SiGe layer has been deposited, is characterized in that the transistor is laterally bounded in the semiconductor body by grooves which may or may not be filled up with a filler material and which extend from the surface into the semiconductor body to a depth which is greater than the depth of the source and drain zones.

The invention may be used to advantage in integrated circuits with exclusively n-channel field effect transistors. An important class of integrated circuits comprises complementary field effect transistors (CMOS) in which p-channel transistors are present as well as n-channel transistors. A semiconductor device incorporating a further aspect of the invention is characterized in that at the area of an n-type surface region adjoining the surface the semiconductor body is provided with a p-channel field effect transistor with insulated gate and with p-type source and drain zones which are provided in the n-type surface region and are mutually separated by an interposed channel region, the n-type surface region being provided with a buried n-type zone below the channel region, which zone is doped with As or Sb with a doping concentration higher than that of the channel region adjoining the surface and that of a buried $Si_{1-x}Ge_x$ layer. This aspect of the invention is based inter alia on the recognition that it is desirable also for the p-channel transistor that a strongly doped n-type layer should be provided at a depth of a few tens of nanometers from the surface for reasons analogous to those for the n-channel transistor. SiGe, however, does not form a diffusion barrier for n-type impurities. Accordingly, the channel region would be strongly doped by the buried layer when P is used, which has a diffusion constant comparable to that of B. The use of the n-type dopant As, or possibly Sb, renders it possible to choose the process conditions in a simple manner such that the diffusion of the As atoms or the Sb atoms stops at the boundary between the SiGe layer and the intrinsic channel region situated above it, so that the channel region nevertheless remains practically intrinsic at the surface.

BRIEF DESCRIPTION OF THE DRAWING

These and other aspects of the invention will be explained in more detail with reference to an embodiment. In the drawing.

Figure 1:
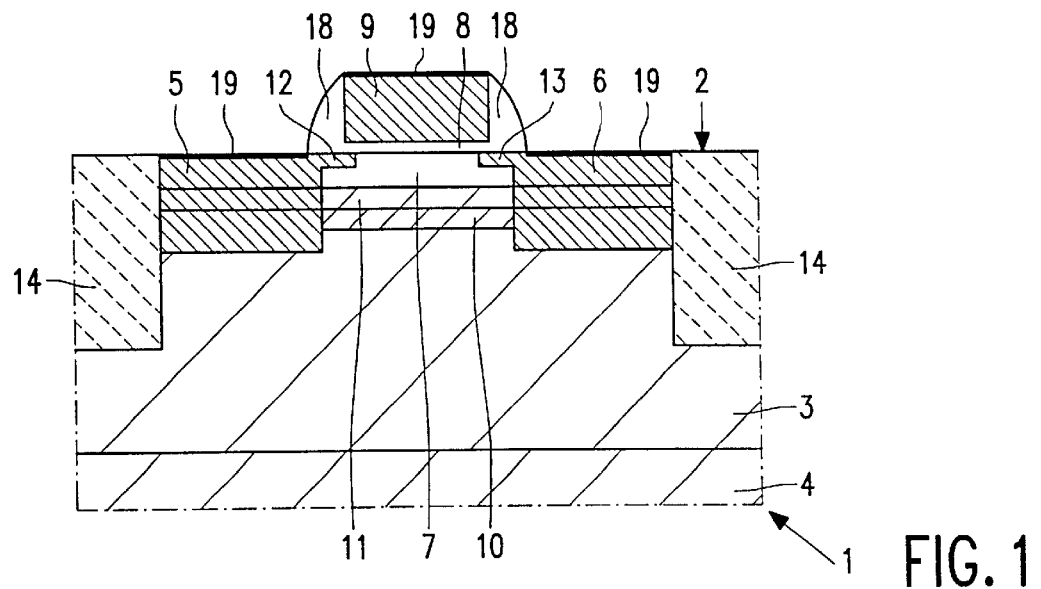
FIG. 1 is a cross-section of a semiconductor device according to the invention.

It is noted that the drawing is diagrammatic only and not true to scale, and that in particular the dimensions in vertical direction are shown on an enlarged scale compared with the dimensions in other directions.

DESCRIPTION OF THE PREFERRED EMBODIMENTS

The semiconductor device of FIG. 1 may be a discrete transistor, no further active circuit elements being provided in the semiconductor device. Since the invention is of particular importance for transistors having very small dimensions, especially in the deep sub-micron region, however, the device as shown in FIG. 1 will usually form part of an integrated circuit with a very large number of circuit elements. The device comprises a semiconductor body 1 of silicon with a p-type surface region 3 adjoining a surface 2. The semiconductor body 1 may have a doping throughout its thickness uniform with the doping concentration of the surface region 3. In an alternative embodiment, as shown in FIG. 1, the p-type region is formed by a comparatively weakly doped layer epitaxially provided on a strongly doped p-type substrate 4. The semiconductor body is provided with an insulated-gate n-channel field effect transistor or MOST. The transistor comprises two main electrode regions 5 and 6 in the form of n-type surface zones which form the source and drain zones of the transistor. The zones 5 and 6 are mutually separated by an interposed channel region 7 which adjoins the surface 2 and whose length lies in the deep sub-micron region, for example, 0.18 $\mu m$. The surface of the channel region is covered by a gate dielectric, for example an oxide layer 8 of, for example, 4 nm thickness, which separates the channel region from the gate electrode 9. The doping concentration of the region 7 is very low compared with that of the other zones or regions. Accordingly, the channel region 7 will be considered a zone of intrinsic silicon hereinafter. The surface region 3 is in addition provided with a buried p-type zone 10 which extends below the channel region at a very small distance, i.e. at a distance of a few tens of nanometers from the surface 2. The doping level of the buried zone is high, at least higher than that of the channel region 7 by a few orders of magnitude such that during operation the zone 10 may be regarded as an equipotential plane or ground plane.

According to the invention, the surface region 3 also comprises a buried layer 11 in which part of the Si atoms are replaced by Ge atoms. This layer will be referred to as $Si_{1-x}Ge_x$ hereinafter (x representing the molar fraction of Ge), or SiGe layer for short, but it should be borne in mind that other substituents may be found such as, for example, C, in addition to Ge in the crystal lattice. Diffusion of boron from the strongly doped layer 10 to the intrinsic region 7 is inhibited by the SiGe layer 11. As a result, it is not necessary to carry out an additional As implantation into the region 7, so that the mobility of the electrons at the surface remains high. The thickness of the SiGe layer may be chosen to be approximately 20 nm for a Ge content x of approximately 0.3. This thickness value, for which the layer 11 still acts as a satisfactory diffusion barrier, is so low that the lattice distances in the SiGe layer 11 are equal or at least substantially equal to those of Si in a direction parallel to the surface 2. This means that the intrinsic region 7 can be provided epitaxially in a simple manner.

The source and drain zones 5 and 6 extend from the surface 2 to beyond the strongly doped zone 10 into the more weakly doped surface region 3, so that the parasitic junction capacitance of these zones is kept low. To obtain a controlled overlap between the gate electrode 9 on the one hand and the source and drain zones on the other hand, the zones 5 and 6 are each provided with an extension 12, 13, respectively, whose thicknesses are smaller than those of the zones 5 and 6.

The lateral boundary of the active region within the semiconductor body in this embodiment comprises grooves 14 which extend to a greater depth into the semiconductor body than do the source and drain zones and which are filled with oxide or with some other suitable material or combination of materials. The grooves 14 may be formed after the layer structure 10, 11, 7 has been formed without high-temperature steps which could disturb this layer structure.

Figure 2:
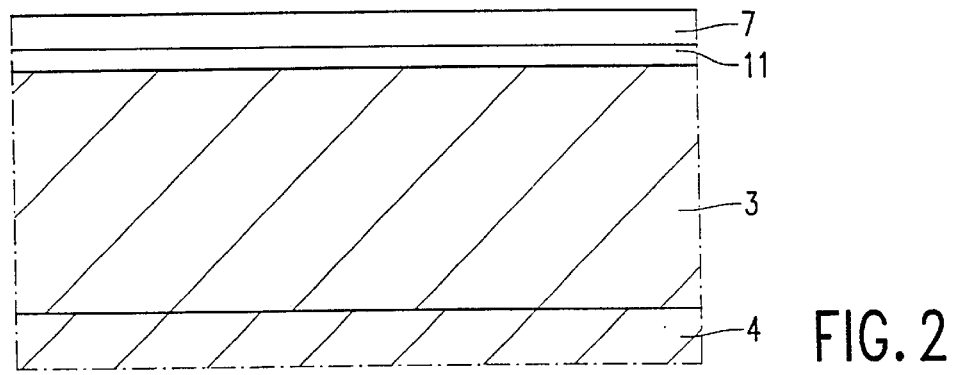
FIGS. 2 to 6 are cross-sections of this device in a few stages of its manufacture.
Figure 3:
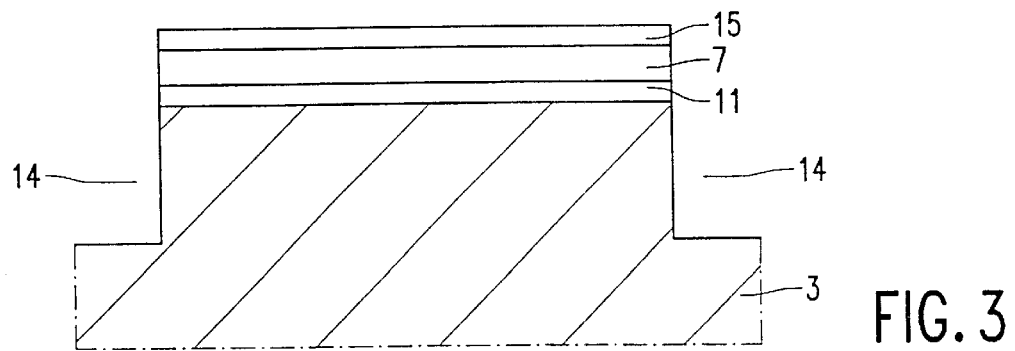
Figure 4:
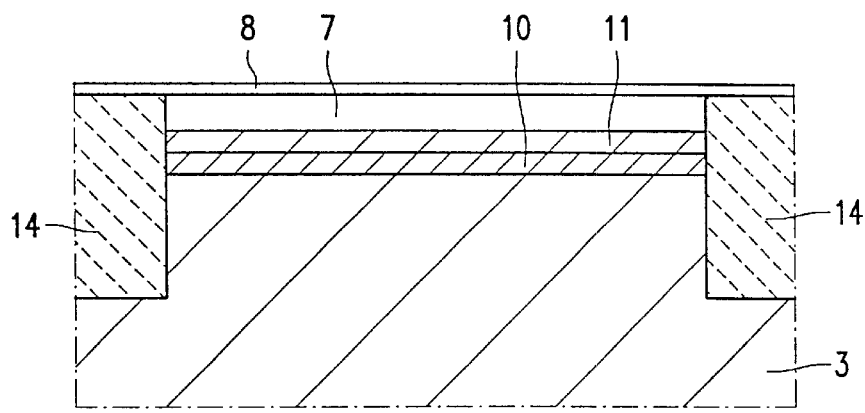

FIGS. 2 to 4 show a few steps in the manufacture of the transistor of FIG. 1. The drawing starts with the situation in which the surface region 3 in the form of a weakly doped p-type epitaxial layer with a doping concentration of, for example, $10^{17}$ atoms per $cm^3$ and a thickness of between 1 and 3 $\mu m$ has been provided on the (100) oriented surface of the strongly doped p-type substrate. The $Si_{1-x}Ge_x$ layer 11 is subsequently provided epitaxially, x being approximately 0.3 and the thickness of the layer approximately 20 nm. The layer 11 is furthermore intrinsic, i.e. the concentration of p-type or n-type dopants is kept as low as possible. Then the intrinsic Si layer 7, from which the channel region is formed, is epitaxially provided on the SiGe layer 11. The device in this stage of the process is shown in FIG. 2. In a next step, the active regions are defined, for which an etching mask 15 is provided on the surface (FIG. 3), after which the grooves 14 are formed by anisotropic etching. A specific value for the width of the grooves 14 is, for example, 0.25 $\mu m$. The grooves are filled with oxide in a manner known per se, whereby a substantially plane surface is obtained. After removal of the mask 15, the buried layer 10 is formed through a boron ion implantation with a doping of, for example, $10^{13}$ atoms per cm$^2$ and an energy of 25 keV (FIG. 4), whereby a thin, strongly doped p-type layer is obtained with a maximum doping of approximately $10^{18}$ boron atoms per cm$^3$. Damage in the crystal lattice may be eliminated by means of a RTA (Rapid Thermal Anneal) treatment, for example a heating step at 950° C. for 25 s. The gate oxide 8 is subsequently provided to a thickness of approximately 4 nm by thermal oxidation at a temperature of, for example 850° C. This stage is shown in FIG. 4.

Figure 5:
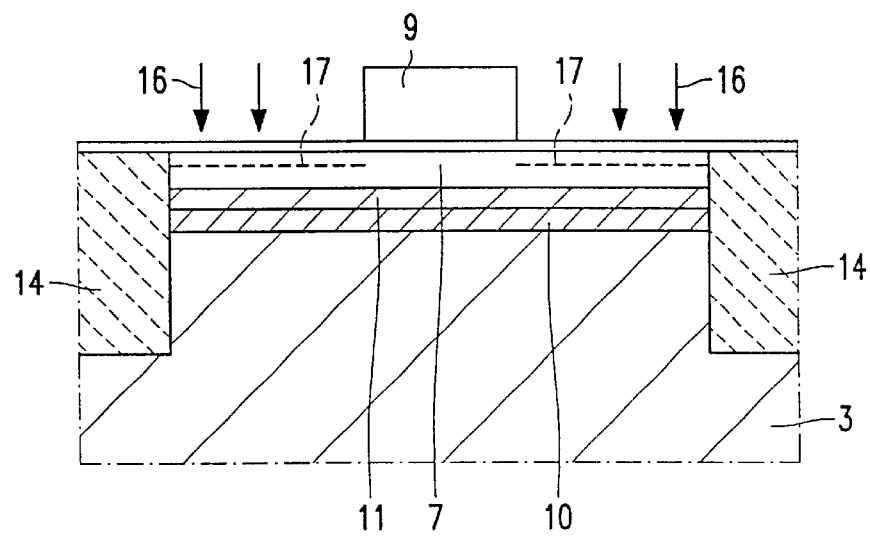
Figure 6:
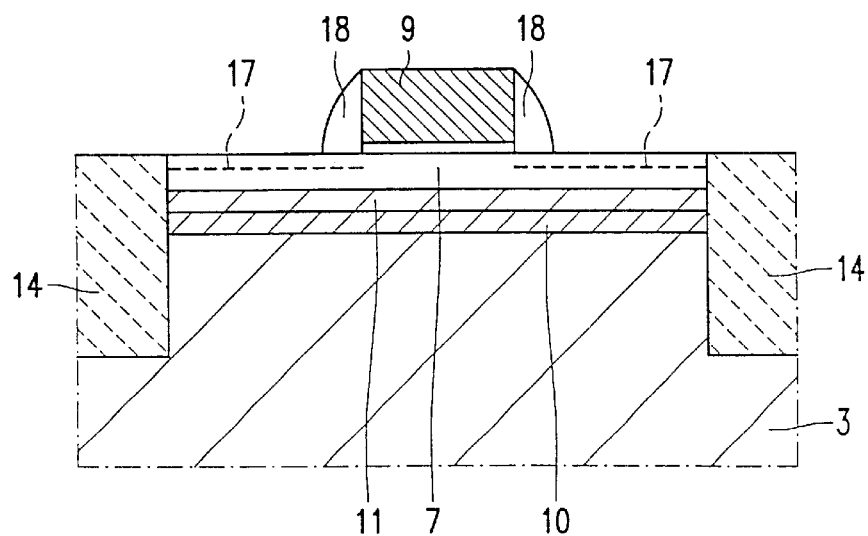

During the RTA step mentioned above and the oxidation step, the boron in the buried layer 10 has a tendency to diffuse towards the surface. It was found, however, that boron diffusion is effectively decelerated by the SiGe layer, so that the B concentration in the channel region remains low, at least much lower than if the SiGe layer were absent, and the channel region may be regarded as intrinsic also without a compensatory As implantation. The SiGe layer itself may become weakly p-type doped through diffusion of boron. In a next step, a polycrystalline or amorphous silicon layer is deposited to a thickness of approximately 0.2 μm, which may be patterned in a usual manner so as to obtain the gate electrode 9, FIG. 5. The length of the gate electrode is, for example, 0.18 μm. An implantation, diagrammatically indicated with arrows 16, is then carried out to form As-doped regions 17 from which the source/drain extensions 12 and 13 are created after heating. The implantation is carried out, for example, at a density of $10^{14}$ atoms per cm$^2$ and an implantation energy of approximately 10 keV. The depth of the zone obtained, and thus also the overlap with the gate 9 are very small at this energy, so that the effective channel length corresponds substantially to the length of the gate electrode. The gate electrode 9 may also be doped simultaneously with this implantation. Subsequently, the spacers 18 (FIG. 6) are formed on the flanks of the gate electrode 9 in a usual manner, for example through deposition and anisotropic etching-back of a layer of silicon oxide or silicon nitride. Then As ions are implanted again so as to obtain the deep source and drain zones 5 and 6 with the spacers 18 acting as an implantation mask. The implantation is carried out with an energy of, for example, 70 keV and a dose of $4\times10^{15}$ per cm$^2$. The gate electrode 9 may also be doped simultaneously with this step. Then a heating step is carried out to eliminate damage in the crystal caused by the implantation and to activate the implantated As ions. RTA is preferably used for this again in order to limit the diffusion of As as much as possible.

Contacts may be provided in a next stage, for example in the form of salicide contacts 19, for which purpose a 30 nm thick Ti layer is deposited, after which the device is heated in an ambience comprising nitrogen. A silicide layer with a thickness of approximately 50 nm arises then in locations where Ti is in contact with Si, while in other 15 locations titanium nitride is formed which may be readily removed selectively, so that the device as depicted in FIG. 1 is obtained.

Figure 11:
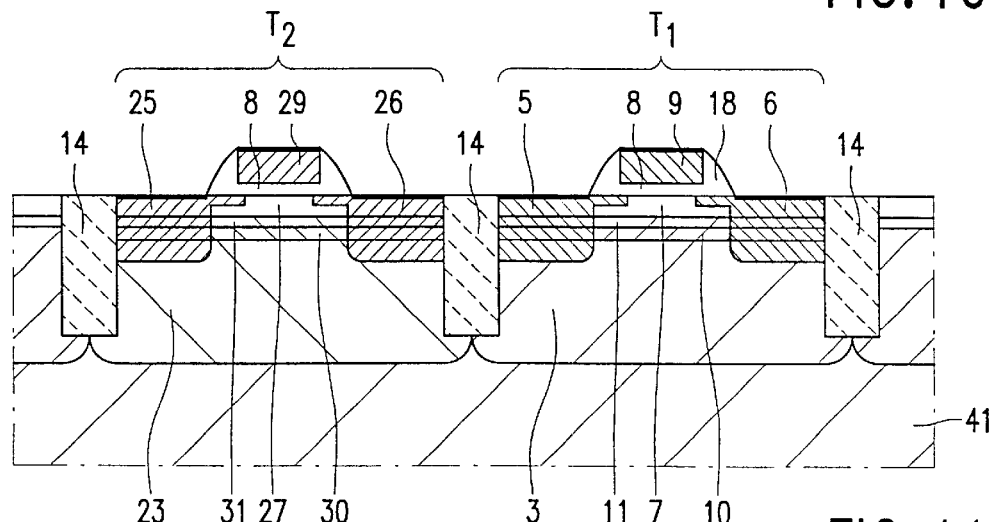

FIG. 11 is a cross-section showing a CMOST device according to the invention. The device comprises besides the n-channel transistor $T_1$ a transistor $T_2$ complementary thereto, i.e. a p-channel transistor. Transistor $T_1$ has a construction corresponding to that of the transistor of the preceding embodiment and is accordingly given the same numerals for ease of reference. The transistor again comprises an intrinsic channel region 7 which is separated from the strongly doped p-type ground plane layer 10 by the SiGe layer 11, analogous to the preceding example. The p-channel field effect transistor $T_2$ comprises an n-type well 23 in which the p-type source and drain zones 25 and 26 are situated. Between the source and drain zones lies the channel region 27 which has a very low doping concentration, analogous to the channel region 7, and which is accordingly regarded as an intrinsic semiconductor region again hereinafter. The gate electrode 29 is provided above the channel region 27. A ground plane region is provided at a very small distance from the surface, taking the form of a thin, strongly doped n-type zone 30 which merges into the intrinsic region 27 via a SiGe layer 31. In general, SiGe has the property that it accelerates the diffusion of n-type impurities instead of decelerating it, as in the case of boron. This is why As is used as the dopant for the n-type ground plane 30. As will diffuse at an accelerated rate into the SiGe layer 31 during the various process steps, such as the formation of the gate oxide, so that this layer 31 will become comparatively strongly n-type doped. As, however, has a very low diffusion rate in Si, so that the diffusion is practically stopped at the boundary between the SiGe layer 31 and the—intrinsic—channel region 27.

Figure 7:
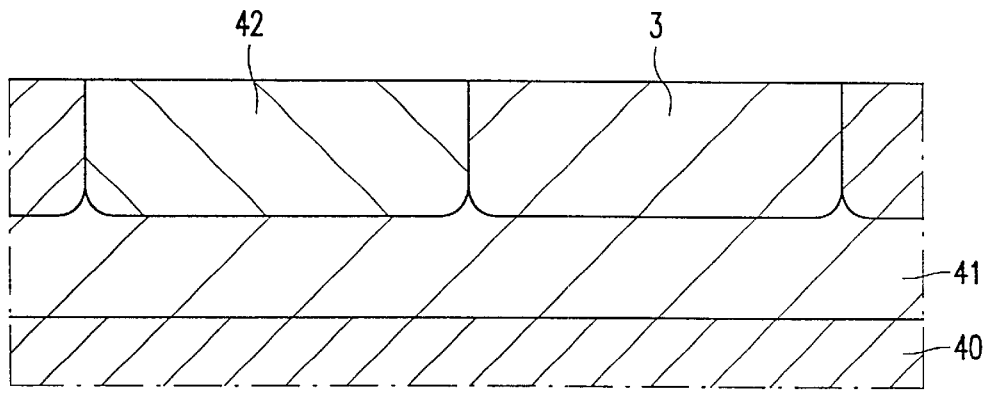
FIGS. 7 to 11 are cross-sections of a second embodiment of a semiconductor device according to the invention in a few stages of its manufacture.
Figure 8:
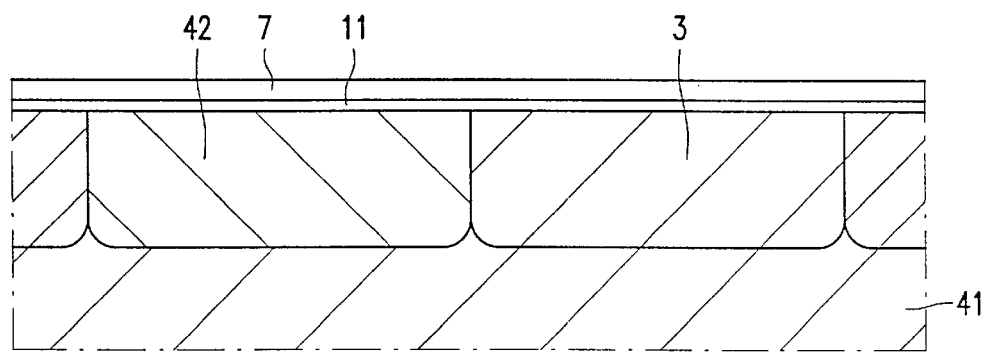
Figure 9:
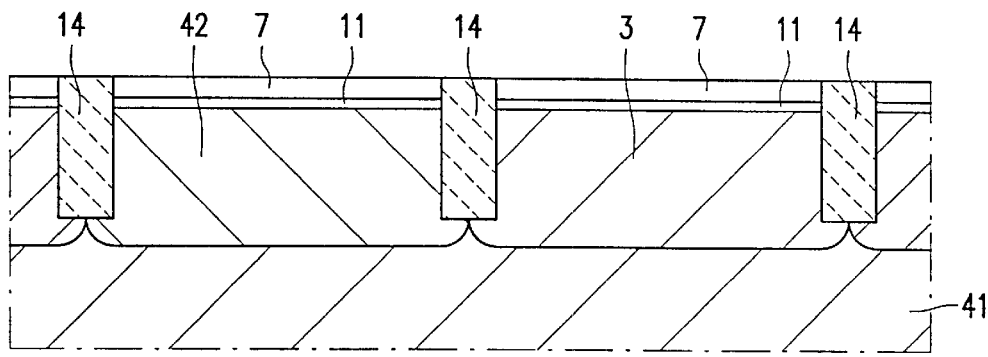

The manufacture of the device of FIG. 11 is described with reference to FIGS. 7 to 10 which show a few stages in the process. The process starts again with a strongly doped p-type silicon substrate 40 on which a less strongly doped p-type epitaxial layer 41 is formed with a concentration of between $10^{14}$ and $10^{15}$ atoms per cm$^3$. It is noted that the low-ohmic substrate 40 is shown in FIG. 7 only, not in FIGS. 8 to 10. A p-type well 3 for the n-channel transistor and an n-type well 42 for the p-channel transistor are formed in the semiconductor body 1 obtained as above in a usual manner, see FIG. 7. The thicknesses of the p-well 3 and of the n-well 42 may have values of between 1 and 3 μm. The average doping concentration is, for example, $10^{17}$ atoms per cm$^3$. An approximately 20 nm thick SiGe layer 11 and an approximately 30 nm intrinsic Si layer 7 are then epitaxially provided in the manner as described with reference to the preceding embodiment, see FIG. 8. The same composition may be chosen for the SiGe layer 11 as in the preceding embodiment. Then grooves 14 are provided (FIG. 9) between the regions 3 and 42, subdividing the intrinsic Si layer 7 and the SiGe layer into a number of separate portions.

Figure 10:
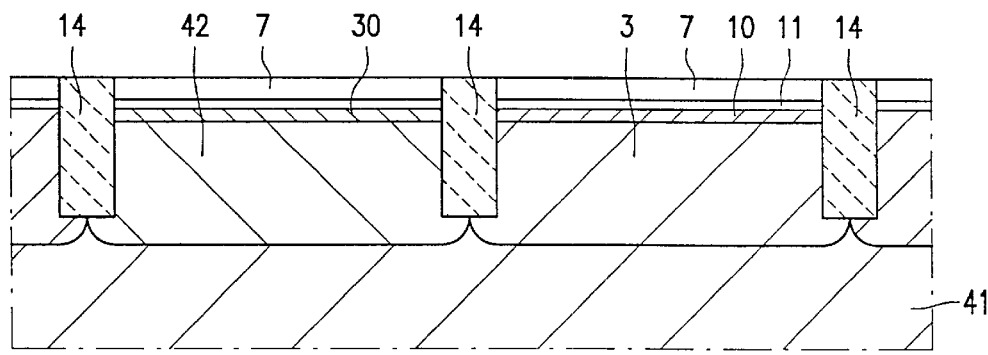

In a next stage shown in FIG. 10, the strongly doped p-type layer 10 and the strongly doped n-type layer 30 are provided below the SiGe layer 11 by means of consecutive masked implantation steps. The layer 10, which has a thickness of, for example, 30 nm, is provided through implantation of boron with an implantation energy of approximately 25 keV and a dose of approximately $10^{13}$ atoms per cm$^2$. The n-type ground plane 30 is formed through implantation of As with an energy of approximately 150 keV and a dose of again approximately $10^{13}$ atoms per cm$^2$. After the implantation steps, an RTA treatment is carried out at a temperature of approximately 950° C. for approximately 25 seconds so as to activate the B and As atoms and restore damage in the crystal. The gate oxide 8 is formed in the subsequent oxidation step in the manner as described with reference to the preceding embodiment. Diffusion of boron atoms from the strongly doped layer 10 is decelerated by the SiGe layer 11 during this thermal step, so that the doping level in the channel region 7 remains very low. The As atoms in the strongly doped layer 30 of the p-channel MOST do diffuse into the SiGe layer, whereby the comparitively strongly doped n-type SiGe layer 31 is formed in transistor $T_2$. Since the diffusion rate of As in Si is very low, however, the diffusion of As stops practically at the boundary between the SiGe layer 31 and the Si layer 7. As a result, the doping concentration in the channel region of the p-channel transistor also remains very low, and the advantages of the ground plane configuration in the n-channel transistor are thus also obtained in the p-channel transistor $T_2$.

After the gate oxide 8 has been formed, an undoped poly layer is deposited from which the gates 9 of $T_1$ and 29 of $T_2$ are formed. The n-type source and drain zones 5 and 6 of the n-channel transistor $T_1$ and the p-type source and drain zones 25 and 26 of the p-channel transistor $T_2$ are formed through consecutive masking and doping steps. The same values as in the preceding embodiment may be used for the dosing and implantation energy of the n-type dopant for making the source and drain zones of the n-channel transistor $T_1$. The extensions of the source and drain zones 25, 26 of the p-channel transistor $T_2$ may be formed through implantation of BF2 ions with a dose of approximately $5 \times 10^{14}$ ions per cm² and an energy of approximately 5 keV. The deep zones may be formed through implantation of BF2 with a dose of approximately $2.5 \times 10^{15}$ ions per cm² and an energy of approximately 20 keV. The gate 29 may be p-type doped simultaneously with either or both implantations. After an RTA treatment, which is as short as possible so as to prevent the diffusion of impurities as much as possible, silicide contacts may again be provided on the source and drain zones and gate electrodes in the manner described above, after which further usual steps can be carried out, such as the provision of insulating layers and wiring.

Figure 12:
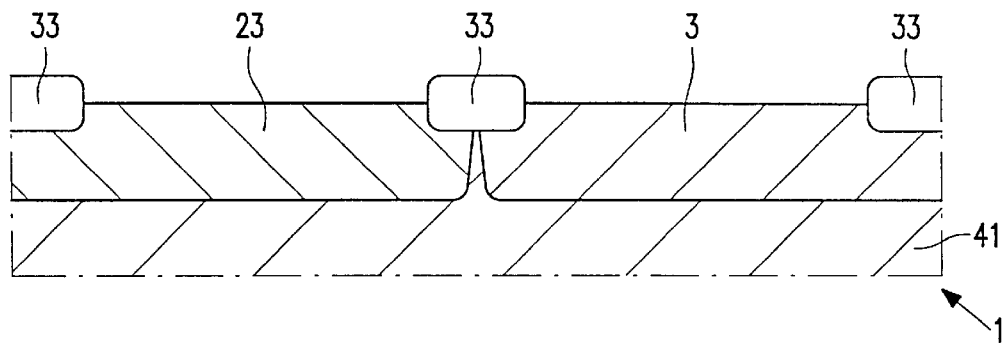
FIGS. 12 to 14 are cross-sections of a third embodiment of a semiconductor device according to the invention in a few stages of its manufacture.
Figure 13:
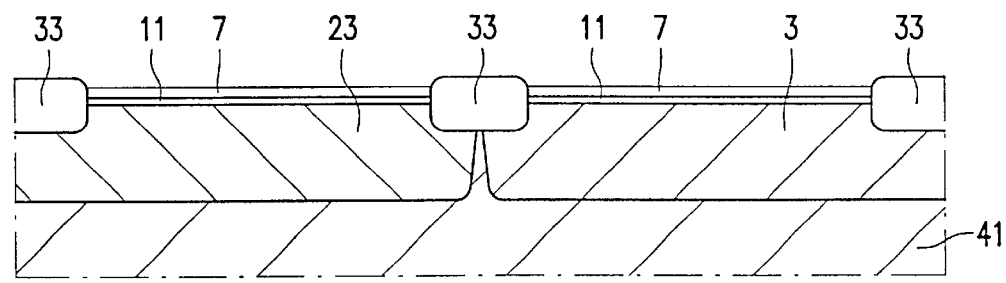
Figure 14:
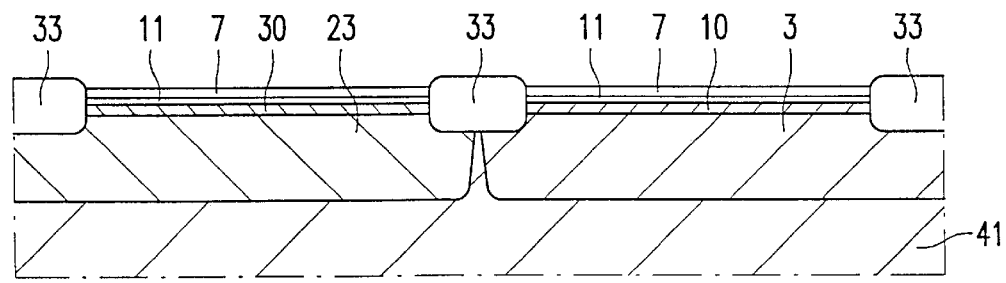

Grooves were used for the boundaries of the active regions in the examples described above, possibly filled up with a suitable substance for obtaining a plane surface. FIGS. 12 to 14 show in cross-section an embodiment in which the active regions are bounded by a conventional field oxide which may be obtained by means of a LOCOS process known per se. FIG. 12 shows the situation where the semiconductor body has been provided with a pattern 33 of silicon oxide with a thickness of approximately 0.3 μm forming the field oxide at its surface by means of masked oxidation. The p-type well 3 and the n-type well 23 may then be provided through ion implantation. Subsequently, the SiGe layer 11 and the intrinsic Si layer 7 are deposited in the active regions between the oxide layers 33 by selective epitaxy, see FIG. 13. The thickness and the composition of the SiGe layer 11 and the thickness of the intrinsic layer 7 correspond to the thickness and composition of the SiGe layer 11 and Si layer 7 in the first embodiment. In a next series of steps, the strongly doped n-type ground plane 30 and p-type ground plane 10 are then provided below the SiGe layer 11 at a short distance from the surface. This stage is shown in FIG. 14. The process may be continued as in the preceding embodiment with the growth of the gate oxide, followed by the formation of the gate electrodes and the source and drain zones as described above.

It will be obvious that the invention is not limited to the embodiments described here, but that many more variations are possible to those skilled in the art within the scope of the invention. Thus, for example, the sequence of the various process steps may be changed in the examples described, for example, the implantation for the ground plane may be carried out first, and the SiGe layer and the intrinsic layer may be provided epitaxially afterwards. If the SiGe layer and the intrinsic layer are provided through selective epitaxy, it is possible to mask the semiconductor body locally against epitaxy where said layers are not necessary, for example in locations where bipolar transistors will be formed.

What is claimed is:

1. A CMOS transistor semiconductor device comprising a semiconductor body of silicon having at least one p-type surface region provided with an n-type channel field effect transistor and at least one n-type surface region provided with a p-type channel field effect transistor, the n-type and p-type channel field effect transistors being of symmetrical configuration, (a) the p-type surface region comprising:
   i. n-type source and drain zones provided in the surface region,
   ii. a substantially intrinsic channel region provided in the surface region interposed between the n-type source and drain zones, a portion of the channel region adjoining the surface,
   iii. a buried $Si_{1-x}Ge_x$ layer in the surface region, x representing the molar fraction of Ge, the buried $Si_{1-x}Ge_x$ layer extending below the channel region,
   iv. a buried p-type doped zone extending below the $Si_{1-x}Ge_x$ layer, the p-type doped zone having a several orders of magnitude higher doping concentration than the channel region,
   wherein the $Si_{1-x}Ge_x$ layer provided in the p-type surface region forms a diffusion barrier between the comparatively weakly doped channel region adjoining the surface and the comparatively strongly doped buried p-type zone, and the n-type source and drain zones extend from the surface deeper into the semiconductor body than do the buried p-type zone and the $Si_{1-x}Ge_x$ layer; and (b) the n-type surface region comprising:
   i. p-type source and drain zones provided in the surface region,
   ii. a substantially intrinsic channel region provided in the surface region interposed between the p-type source and drain zones,
   iii. a buried $Si_{1-x}Ge_x$ layer in the surface region, x representing the molar fraction of Ge, the buried $Si_{1-x}Ge_x$ layer extending below the channel region,
   iv. a buried n-type doped zone extending below the $Si_{1-x}Ge_x$ layer, the n-type doped zone doped with one of As and Sb and having a several orders of magnitude higher doping concentration than the channel region, wherein the $Si_{1-x}Ge_x$ layer provided in the n-type surface region does not reduce the diffusion rate of As or Sb from the n-type doped zone toward the channel region but diffusion is substantially reduced at the interface of the $Si_{1-x}Ge_x$ layer and the channel region, and wherein said $Si_{1-x}Ge_x$ layer comprises an epitaxial layer and said substantially intrinsic channel regions are both formed from a single intrinsic epitaxial layer provided on said epitaxial $Si_{1-x}Ge_x$ layer.

2. A semiconductor device as claimed in claim 1, characterized in that the transistor is laterally bounded in the semiconductor body by grooves which may or may not be filled up with a filler material and which extend from the surface into the semiconductor body to a depth which is greater than the depth of the source and drain zones.

3. A semiconductor device as claimed in claim 1, characterized in that the distance from the surface to the buried n-type zone is substantially equal to the distance between the surface and the buried SiGe layer.

4. A semiconductor device as claimed in claim 1 characterized in that the buried SiGe layer has a thickness of at most 50 nm.

5. A semiconductor device as claimed in claim 4, characterized in that the thickness of the buried SiGe layer has a value which lies in the range defined by 20 nm as the lower limit and 30 nm as the upper limit.

6. A semiconductor device as claimed in claim 4, characterized in that the molar fraction x in the buried $Si_{1-x}Ge_x$ layer has a value of approximately 0.3.

\* \* \* \* \*